United States Patent
Mellot (10) Patent No.: US 11,500,095 B2
(45) Date of Patent: Nov. 15, 2022

(54) METHOD FOR DETERMINING THE DISTANCE SEPARATING AN OBJECT AND AN OPTICAL DETECTION SYSTEM, AND CORRESPONDING SYSTEM

(71) Applicant: STMicroelectronics (Grenoble 2) SAS, Grenoble (FR)

(72) Inventor: Pascal Mellot, Lans en Vercors (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 932 days.

(21) Appl. No.: 16/289,016

(22) Filed: Feb. 28, 2019

(65) Prior Publication Data

US 2019/0285750 A1    Sep. 19, 2019

(30) Foreign Application Priority Data

Mar. 14, 2018   (FR) ...................................... 1852193

(51) Int. Cl.

| | |
|---|---|
| *G01S 17/36* | (2006.01) |
| *G01S 7/4915* | (2020.01) |
| *G01S 7/481* | (2006.01) |
| *H01L 31/107* | (2006.01) |
| *G06F 17/12* | (2006.01) |
| *G01S 17/10* | (2020.01) |
| *G01S 17/931* | (2020.01) |

(52) U.S. Cl.
CPC ............ *G01S 17/36* (2013.01); *G01S 7/4814* (2013.01); *G01S 7/4915* (2013.01); *G01S 17/10* (2013.01); *G01S 17/931* (2020.01); *G06F 17/12* (2013.01); *H01L 31/107* (2013.01)

(58) Field of Classification Search
CPC ...... G01S 17/36; G01S 17/931; G01S 7/4814; G01S 7/4815; G01S 17/10; G06F 17/12; H01L 31/107
USPC ....................................................... 356/5.11
See application file for complete search history.

(56) References Cited

U.S. PATENT DOCUMENTS

2019/0383906 A1*  12/2019  Nakamura ............. G01S 17/10

OTHER PUBLICATIONS

Anonymous, "Least Common Multiple", Wikipedia, Retrieved from https://en.wikipedia.org/w/index.php?title_Least_common_multiple &oldid=828245491, Mar. 1, 2018, 8 pages.
Van Den Broeke, Gerben, "Decreasing time-of-flight 3D-camera range ambiguity", Jul. 16, 2011, 6 pages.
(Continued)

*Primary Examiner* — Aditya S Bhat
(74) *Attorney, Agent, or Firm* — Slater Matsil, LLP (57) ABSTRACT

A method, for determining the real distance separating an object and an optical detection system, includes, from several so-called reported distances respectively less than or equal to individual reference distances dependent respectively on modulation frequencies: in a first step, determining an initial deviation coefficient between the reported distances and incrementing the smallest of the reported distances with the corresponding individual reference distance; then in a second step, determining a current deviation coefficient between the current distances obtained in the preceding step and incrementing the smallest of the current distances with the corresponding individual reference distance; and in a third step, repeating the second step until all the current distances exceed a common reference distance greater than the individual reference distances.

20 Claims, 4 Drawing Sheets

(56) References Cited

OTHER PUBLICATIONS

Bronzi, Danilo, et al., "Automotive Three-Dimensional Vision Through a Single-Photon Counting SPAD Camera", IEEE Transactions on Intelligent Transportation Systems, vol. 17, No. 3, Mar. 2016, 14 pages.

Krichel, Nils J., et al., "Resolving range ambiguity in a photon counting depth imager operating at kilometer distances", Optics Express, vol. 18, No. 9, Apr. 26, 2010, pp. 9192-9206.

Villa, F., et al., "3D SPAD camera for Advanced Driver Assistance", 2017 International Conference of Electrical and Electronic Technologies for Automotive AEIT, Jun. 15, 2017, 5 pages.

* cited by examiner

METHOD FOR DETERMINING THE DISTANCE SEPARATING AN OBJECT AND AN OPTICAL DETECTION SYSTEM, AND CORRESPONDING SYSTEM

CROSS-REFERENCE TO RELATED APPLICATIONS

This application claims the benefit of French Application No. 1852193, filed on Mar. 14, 2018, which application is hereby incorporated herein by reference.

TECHNICAL FIELD

This disclosure relates generally to optical detection systems and in particular embodiments to a method for determining a distance separating an object and an optical detection system and a corresponding system for executing the method.

BACKGROUND

Generally, a so-called indirect time-of-flight ("iToF") optical detection system delivers, in a detection field, a radiation of periodic modulated optical light from, for example, a vertical-cavity surface-emitting laser diode, commonly referred to by the person skilled in the art by the acronym "VCSEL", and indirectly measures the distance separating an object situated in the detection field and the so-called "iToF" system via a measurement of phase shift of the optical signal received after the reflection on the object relative to the emitted optical light radiation.

It is also possible to prolong collection of optical signal data over several periods of the emitted optical light radiation so as to improve the accuracy of the measurement.

On the one hand, the repeatability of such a system on the measurement of the distance is a linear function of the frequency of the modulated optical light radiation. It is therefore preferable to increase the frequency of the emitted radiation.

But, on the other hand, the maximum measurable distance of such a so-called "iToF" system depends directly on the frequency of the modulated optical light radiation. This maximum measurable distance decreases with the increasing of the frequency. Consequently, it is also preferable to limit the frequency of the emitted radiation so as to prolong the maximum measurable distance, particularly in demanding practical cases.

One possible solution for addressing this kind of contradictory problem is based on the use of a combination of multiple radiation frequencies.

More specifically, an optical detection system adapted to use such a combination emits sequentially, to an object situated in its detection field, several optical light radiations modulated at different frequencies and determines, respectively, several so-called reported distances, corresponding respectively to the optical light radiations modulated at different frequencies.

Each reported distance is less than or equal to a maximum measurable distance dependent on the corresponding modulation frequency. These reported distances can be different if the real distance separating the object and the optical detection system is greater than any one of the maximum measurable distances.

A consistency test is consequently necessary to determine the real distance from the reported distances.

However, conventional consistency tests generally require complicated methods, particularly if at least three different modulation frequencies are used, and generally result in environmental noise or standard deviations of the signals received after the reflections on the object to be measured that are unsatisfactory.

Thus, there is a need to propose a technical solution of low complexity for systematically measuring the real distance separating the object and the optical detection system from the reported distances by using the optical light radiations modulated at different frequencies so as to reduce the noise or the standard deviations mentioned above.

SUMMARY

According to one aspect, a method is proposed for determining the real distance separating an object and an optical detection system. The determination method includes, from several radiations emitted by the system and modulated at different modulation frequencies and from several so-called reported distances respectively less than or equal to individual reference distances dependent respectively on the modulation frequencies, in a step a) a determination of an initial deviation coefficient between the reported distances and an incrementation of the smallest of the reported distances with the corresponding individual reference distance, then in a step b) a determination of a current deviation coefficient between the current distances obtained in the preceding step and an incrementation of the smallest of the current distances with the corresponding individual reference distance, and in a step c) a repetition of the step b) until all the current distances exceed a common reference distance greater than the individual reference distances, and a determination of the real distance from the current distances associated with the deviation coefficient having the smallest value.

Advantageously, such a method makes it possible to systematically determine the real distance by taking into account all of the reported distances.

The term "several" is understood to mean "at least two" (e.g., a plurality).

The current deviation coefficient in fact represents a level of deviations between the current distances. The real distance is finally obtained by the computation of the average of the current distances associated with the smallest current deviation coefficient, advantageously making it possible to reduce, even minimize, the noise or the standard deviations.

According to one implementation, the step a) further includes a storage of the initial deviation coefficient and of the several reported distances, and the step b) further includes a comparison between the current deviation coefficient and the deviation coefficient stored in the preceding step, and if the current deviation coefficient is less than the stored deviation coefficient, respective replacements of the stored deviation coefficient and of the current distances stored in the preceding step by the current deviation coefficient and the current distances.

As a non-limiting example, the value of the initial deviation coefficient can for example be equal to the sum of the absolute differences of the values of the reported distances taken two-by-two and the value of the current deviation coefficient can for example be equal to the sum of the absolute differences of the values of the current distances taken two-by-two.

As a variant, the value of the initial deviation coefficient can for example be equal to the sum of the squares of the differences of the values of the reported distances taken two-by-two and the value of the current deviation coefficient can for example be equal to the sum of the squares of the differences of the values of the current distances taken two-by-two.

According to another implementation, the common reference distance is the lowest common multiple of all the individual reference distances.

According to yet another implementation, each individual reference distance is equal to half the distance travelled by the light for a duration equal to the inverse of the corresponding modulation frequency.

In other words, each individual reference distance corresponds to the maximum distance measurable by the optical detection system by using the optical light radiation modulated at the corresponding frequency.

As a non-limiting indication, the method can for example further include respective and sequential measurements of phase shifts of the reflected radiations received after reflections of the emitted radiations on the object relative to the emitted radiations so as to respectively determine the reported distances.

According to another aspect, an optical detection system is proposed that is configured to determine the real distance separating an object and the optical detection system from several radiations emitted by the system and modulated at different modulation frequencies and from several so-called reported distances respectively less than or equal to individual reference distances dependent respectively on the modulation frequencies.

The system includes processing circuit configured to in a step a) determine an initial deviation coefficient between the reported distances and increment the smallest of the reported distances with the corresponding individual reference distance, then in a step b) determine a current deviation coefficient between the current distances obtained in the preceding step and increment the smallest of the current distances with the corresponding individual reference distance, and in a step c) repeat the step b) until all the current distances exceed a common reference distance greater than the individual reference distances, and determine the real distance from the current distances associated with the deviation coefficient having the smallest value.

According to one embodiment, the processing circuit include a storage stage configured to, in the step a), store the initial deviation coefficient and the several reported distances, and a computation stage configured to, in the step b), compare the current deviation coefficient and the deviation coefficient stored in the preceding step, and, if the current deviation coefficient is less than the stored deviation coefficient, respectively replace the stored deviation coefficient and the current distances stored in the preceding step by the current deviation coefficient and the current distances.

According to another embodiment, the value of the initial deviation coefficient is equal to the sum of the absolute differences of the values of the reported distances taken two-by-two and the value of the current deviation coefficient is equal to the sum of the absolute differences of the values of the current distances taken two-by-two.

The value of the initial deviation coefficient can for example be equal to the sum of the squares of the differences of the values of the reported distances taken two-by-two and the value of the current deviation coefficient can for example be equal to the sum of the squares of the differences of the values of the current distances taken two-by-two.

As a non-limiting example, the common reference distance can be the lowest common multiple of all the individual reference distances.

Each individual reference distance can for example be equal to half the distance travelled by the light for a duration equal to the inverse of the corresponding modulation frequency.

According to yet another embodiment, the processing circuit further includes a processing stage configured to measure, respectively and sequentially, phase shifts of the reflected radiations received after the reflections of the emitted radiations on the object relative to the several emitted radiations so as to respectively determine the reported distances.

The optical detection system can for example include at least one single-photon detector.

The at least one single-photon detector can for example include a detector of single-photon avalanche diode type.

As a variant, the system can for example include a photodetector of fast photodiode type.

The optical detection system can for example be produced in an integrated manner.

According to another aspect, an electronic apparatus is proposed, for example of tablet or cellular mobile telephone type, incorporating at least one optical detection system as defined above.

According to yet another aspect, a motor vehicle is proposed including at least one optical detection system as defined above.

BRIEF DESCRIPTION OF THE DRAWINGS

Other advantages and features of the invention will become apparent on studying the detailed description of non-limiting implementations and embodiments, and the attached drawings in which.

DETAILED DESCRIPTION OF ILLUSTRATIVE EMBODIMENTS

Implementations and embodiments relate to optical detection systems, more particularly to optical detection systems based on the use of indirect time-of-flight measurement techniques, commonly referred to by the person skilled in the art by the acronym "iToF".

Figure 1:
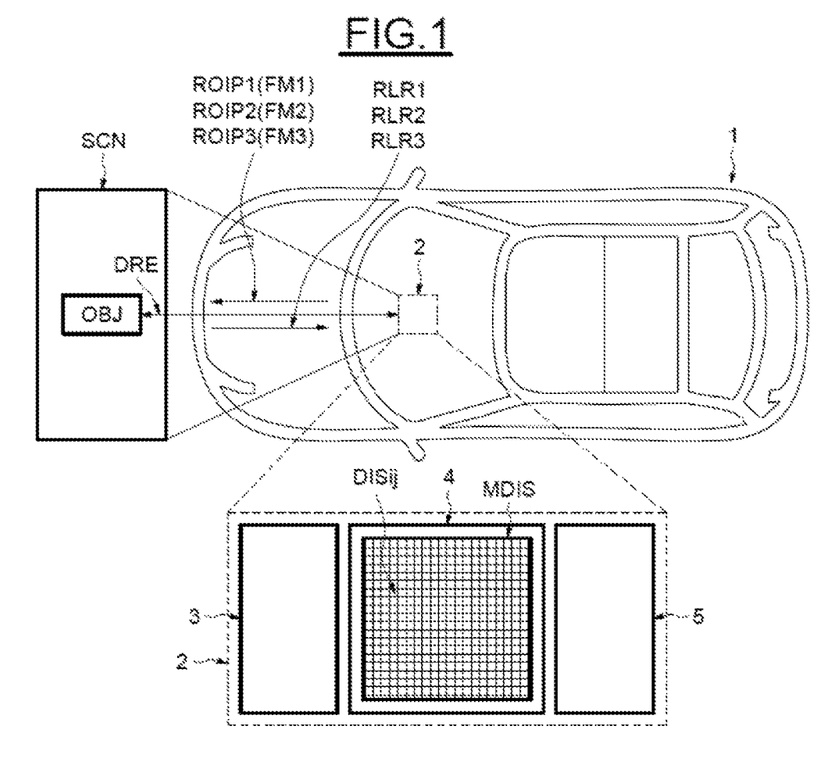
FIGS. 1 to 7 schematically illustrate implementations and embodiments of the invention.

The reference 1 in FIG. 1 denotes a motor vehicle, for example a car 1, equipped with at least one optical detection system, here, for example, a system of remote sensing by light 2 produced in an integrated manner and commonly referred to by the person skilled in the art by the acronym "LiDAR" (Light Detection And Ranging), to detect one or more objects in a detection scene SCN of the LiDAR system 2 and measure the distance or distances separating this object or these objects and the system 2 in the form of a depth map of the scene SCN.

The optical detection system 2 is based on the use of indirect time-of-flight measurement techniques, commonly referred to by the person skilled in the art by the acronym "iToF", and includes emission circuit 3, measurement circuit 4 and processing circuit 5.

As a non-limiting example, the emission circuit 3 includes at least one vertical-cavity surface-emitting laser (VCSEL) diode, known as such to the person skilled in the art.

When the optical detection system 2 is in operation, the emission circuit 3 sequentially emits, to the scene SCN, at least two periodic initial optical radiations, here for example a first, a second and a third periodic initial optical radiations ROIP1, ROIP2, ROIP3 modulated respectively at a first, a second and a third modulation frequencies FM1, FM2, FM3, which may be different frequencies.

If one or more objects OBJ are present in this scene SCN, the system 2 can respectively receive corresponding reflected luminous radiations RLR1, RLR2, RLR3 resulting from the reflections of the initial optical radiations ROIP1, ROIP2, ROIP3 on the object(s).

It should be noted that the choice of the number of periodic initial optical radiations is a trade-off that takes into account the processing speed of the system 2, the processing time allotted by the system for updating the measurement of the real distance or distances separating the object or objects OBJ to be measured and the system 2, the measurement accuracy and the maximum measurable distance sought.

The use of three periodic initial optical radiations ROIP1, ROIP2, ROIP3 for example presents an advantage regarding the measurement accuracy and the maximum measurable distance over a use of two radiations while retaining an acceptable influence on the processing speed of the system 2 and the processing time allotted by the system 2.

The measurement circuit 4 includes at least one optical detection circuit, here, for example, a matrix MDIS of 30×30 optical detection circuits DISij, i=1, 2, 3 . . . 30, j=1, 2, 3 . . . 30 each forming a pixel of this matrix MDIS. Each pixel may be implemented using circuitry known in the art (e.g. including a photodiode and a plurality of transistors that may be sequentially turned on and off to transfer charge from the photodiode into a charge-storing element such as a capacitor).

Each optical detection circuit DISij is sequentially illuminated by the reflected luminous radiations RLR1, RLR2, RLR3. In order to keep account of individual photons correlated in time, each circuit DISij is configured to generate corresponding detection signals SDij_1, SDij_2, SDij_3 if this circuit DISij receives an excitation of the reflected luminous radiations RLR1, RLR2, RLR3 resulting from the reflections of the initial optical radiations ROIP1, ROIP2, ROIP3 on the object(s).

The measurement circuit 4 of each circuit DISij is configured to compile, on the basis of the corresponding detection signals SDij_1, SDij_2, SDij_3, histograms including histogram classes. The value of each histogram class represents the number of photons received by the corresponding optical detection circuit DISij in a chosen integration time window.

Each optical detection circuit DISij of the measurement circuit 4 includes one or more single-photon detectors, here for example a matrix of single-photon detectors DET of the Single Photon Avalanche Diode (SPAD) type known per se to the person skilled in the aft.

As a variant, each optical detection circuit DISij can for example include at least one photodetector of Fast Photo-Diode type (FPD), also known per se to the person skilled in the aft.

It should be noted that the information relating to the phase shifts of the corresponding reflected luminous radiations RLR1, RLR2, RLR3 are contained in the histograms compiled by the measurement circuit 4. The compiling of these histograms is known to the person skilled in the art.

The processing circuit 5 is configured to perform respectively post-processings on the compiled histograms so as to determine so-called reported distances DR1, DR2, DR3 corresponding to the first, second and third periodic initial optical radiations ROIP1, ROIP2, ROIP3 modulated respectively at the first, second and third modulation frequencies FM1, FM2, FM3, and determine the real distance or distances DRE separating the object or objects to be measured and the system 2 on the basis of the reported distances DR1, DR2, DR3.

It should be noted that the emission of the first, second and third periodic initial optical radiations ROIP1, ROIP2, ROIP3 and the determination of the corresponding reported distances are performed in a sequential manner.

Consequently, the measurement circuit 4 and processing circuit 5 are used, by time division, as many times as the number of periodic initial optical radiations, here for example three.

Figure 2:
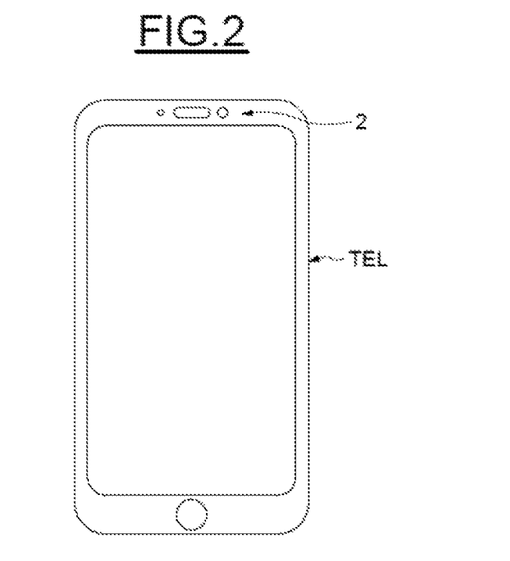

By way of example, such an optical detection system 2 can also be incorporated into an electronic apparatus, for example of the tablet or cellular mobile telephone type, more particularly a smartphone TEL, as illustrated in FIG. 2.

The optical detection system 2 incorporated in the smartphone TEL advantageously allows measurements of three-dimensional depths and applications of three-dimensional imaging, such as camera autofocus and facial recognition.

Figure 3:
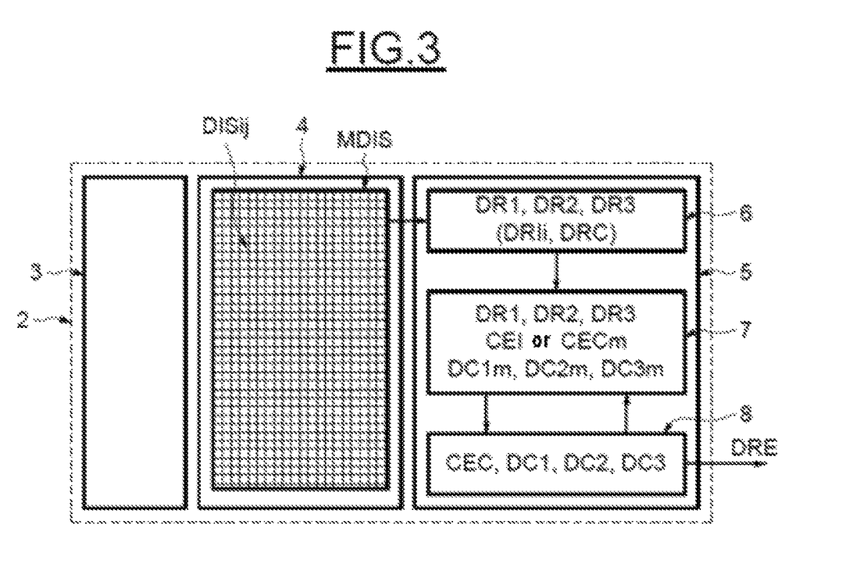

Reference is now made to FIG. 3 to illustrate in detail an exemplary embodiment of the optical detection system 2.

As indicated hereinabove, the measurement circuit 4 of the optical detection system 2 are configured to deliver to the processing circuit 5 the compiled histograms corresponding respectively to the phase shifts of the first, second and third periodic initial optical radiations ROIP1, ROIP2, ROIP3 modulated respectively at the first, second and third modulation frequencies FM1, FM2, FM3.

The processing circuit 5 includes a processing stage 6, a storage stage 7 and a computation stage 8 and is configured to determine the real distance DRE separating an object OBJ and the optical detection system 2 on the basis of the compiled histograms.

By way of indication, the processing circuit 5 can for example be embodied in the form of a digital integrated circuit, for example a microcontroller.

The processing stage 6 is intended to sequentially receive the compiled histograms and configured to sequentially determine the corresponding reported distances DR1, DR2, DR3.

The computation of these reported distances DR1, DR2, DR3 is known per se to the person skilled in the art and each reported distance is equal to or less than the maximum measurable distance, called hereinafter the individual reference distance, as a function of the corresponding modulation frequency.

By way of non-limiting example, the modulation frequencies FM1, FM2, FM3 can respectively be chosen here at 200 MHz, 225 MHz, and 250 MHz.

It should be noted that it is preferable to choose modulation frequencies that are high but sufficiently close together so as to reduce, or indeed minimize, environmental noise or standard deviations of the signals received after the reflections on the object OBJ. For example, the highest modulation frequency preferably does not exceed twice the lowest modulation frequency.

Each individual reference distance DRI1, DRI2, DRI3 is equal to half the distance travelled by the light for a duration equal to the inverse of the corresponding modulation frequency FM1, FM2, FM3.

The corresponding individual reference distances can consequently be computed as follows: $DRI_i = c/(2*FM_i)$, i=1, 2, 3, where c is the speed of light in vacuum.

We thus obtain: DRI1=750 momm, DRI2=666 mm, and DRI3=600 mm.

It should be noted that each reported distance DR1, i=1, 2, 3, is indeed the remainder on dividing the real distance DRE by the corresponding individual reference distance DRIi, stated otherwise DRi=DRE mod DRIi.

Each reported distance DRi is therefore equal to or less than the corresponding individual reference distance DRIi.

When the real distance DRE is greater than any of the individual reference distances DRIi, the reported distances DRi are generally different.

The processing stage 6 is furthermore configured to deliver the reported distances DRi to the storage stage 7 and the storage stage 7 is configured to store these reported distances DRi.

As will be seen hereinbelow, the computation stage 8 is configured to exchange data with the storage stage 7 and determine the real distance DRE on the basis of the reported distances DRi stored in the storage stage 7.

Figure 4:
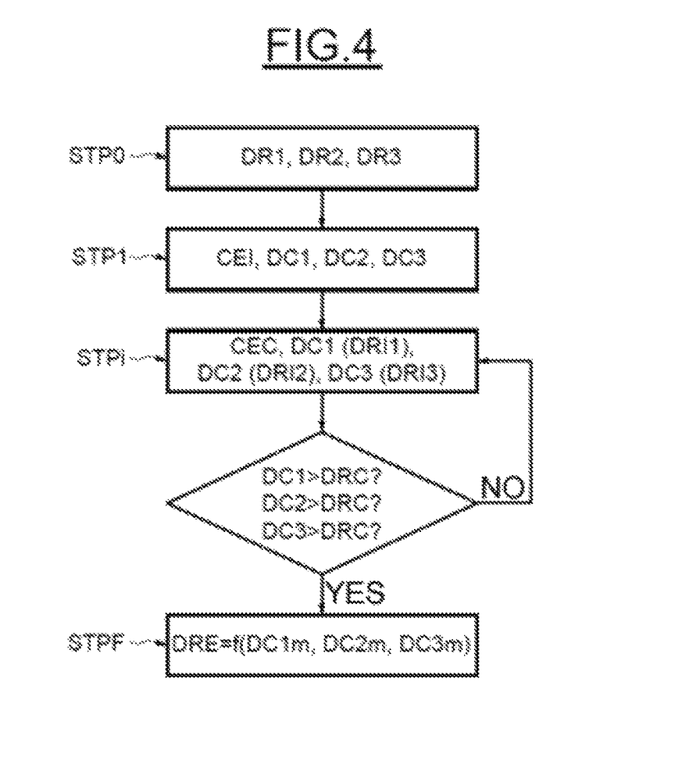

Reference is now made to FIG. 4 to illustrate an exemplary implementation for determining the real distance DRE separating the object to be measured OBJ and the system 2.

In a prior step STPo, several reported distances DR1, DR2, DR3 are obtained on the basis of the respective and sequential measurements of phase shifts of the reflected radiations RLR1, RLR2, RLR3, received after the reflections of the emitted radiations on the object OBJ with respect to the radiations emitted ROIP1, ROIP2, ROIP3 via the measurement circuit 4 and the processing circuit 5.

Thereafter, in an initial step STP1, the computation stage 8 is configured to compute an initial deviation coefficient CEI as a function of the reported distances DR1, DR2, DR3 so as to evaluate the level of deviations between these reported distances DR1, DR2, DR3.

More precisely, the value of the initial deviation coefficient CEI is equal to the sum of the absolute differences of the values of the reported distances taken two-by-two DR1, DR2, DR3 and it is possible to compute the initial deviation coefficient CEI as follows:

$$CEI=abs(DR1-DR2)+abs(DR2-DR3)+abs(DR3-DR1)$$

As a variant, the value of the initial deviation coefficient CEI can also be equal to the sum of the squares of the differences of the values of the reported distances taken two-by-two DR1, DR2, DR3 and it is possible to compute the initial deviation coefficient CEI as follows:

$$CEI=(DR1-DR2)2+(DR2-DR3)2+(DR3-DR1)2$$

The computation stage 8 is configured to deliver the initial deviation coefficient CEI to the storage stage 7 and the storage stage 7 is configured to store the initial deviation coefficient CEI and the reported distances DR1, DR2, DR3 used for the computation of the initial deviation coefficient CEI.

Figure 5:
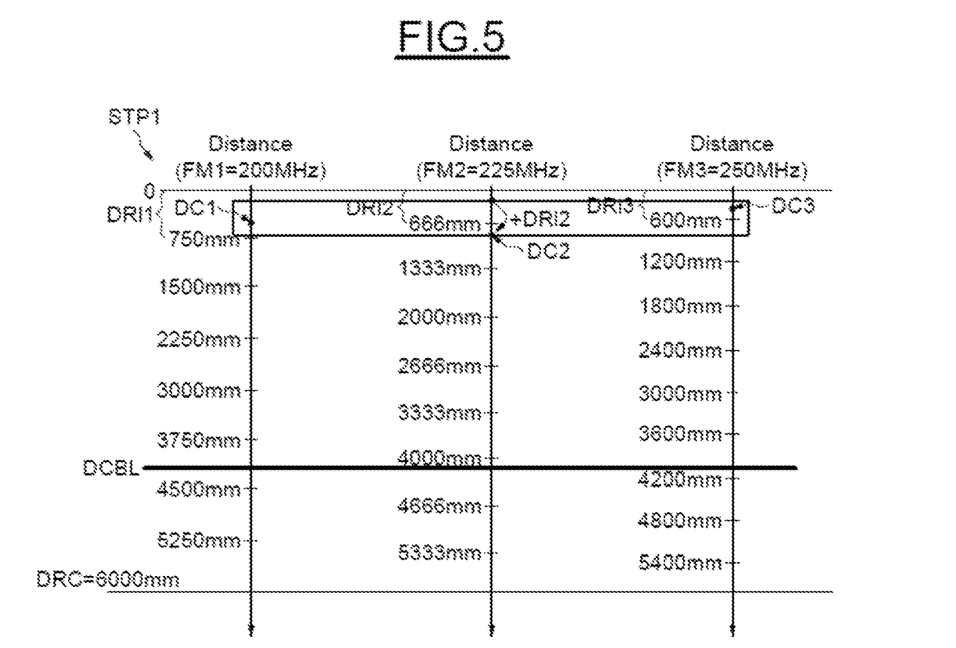

FIG. 5 illustrates a quantitative example of the initial step STP1. It may be noted that the reported distances DR1, DR2, DR3 corresponding to the three modulation frequencies FM1, FM2, FM3 are much smaller than the corresponding individual reference distances DRI1, DRI2, DRI3.

The bold horizontal line situated in the middle of FIG. 5 represents a targeted distance DCBL corresponding to the real distance DRE in an ideal case, that is to say without noise and without deviation, and the horizontal line situated at the bottom of FIG. 5 represents a common reference distance DRC which is the lowest common multiple of all the individual reference distances DRI1, DRI2, DRI3, here DRC=6000 mm.

It should be noted that the common reference distance DRC is much higher than all the individual reference distances DRI1, DRI2, DRI3, thereby advantageously making it possible to prolong the real range of the optical detection system 2.

The computation stage 8 is furthermore configured to generate current distances DC1, DC2, DC3 by incrementing only the smallest of the reported distances, here the second reported distance DR2 (FIG. 5), by its individual reference distance DRI2.

If the current distances DC1, DC2, DC3 do not all exceed the common reference distance DRC, the processing circuit 5 is configured to perform an iterative step STPi (FIG. 4).

Figure 6:
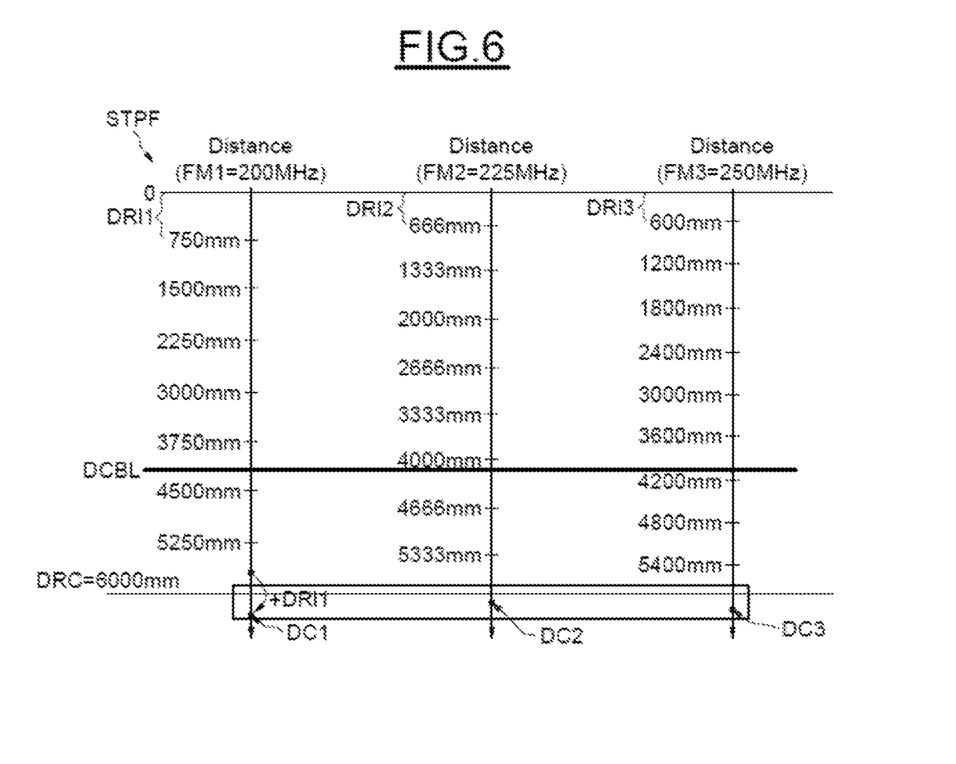

In each iterative step STPi, the computation stage 8 is configured to firstly compute a current deviation coefficient CEC equal to the sum of the absolute differences of the values of the current distances (DC1, DC2, DC3) taken two-by-two or, as a variant, equal to the sum of the squares of the differences of the values of the current distances (DC1, DC2, DC3) taken two-by-two on completion of the previous step, namely:

$$CEC=abs(DC1-DC2)+abs(DC2-DC3)+abs(DC3-DC1); \text{ or}$$

$$CEC=(DC1-DC2)2+(DC2-DC3)2+(DC3-DC1)2$$

compare the current deviation coefficient CEC with the deviation coefficient stored CEI or CECm at the previous step, if the current deviation coefficient CEC is less than the stored deviation coefficient CEI or CEC stored, replace respectively the stored deviation coefficient (CEI, CECm) in the storage stage 7 and the stored distances (DR1, DR2, DR3, DC1m, DC2m, DC3m) with the current deviation coefficient CEC and the current distances DC1, DC2, DC3 on completion of the previous step, and update the current distances DC1, DC2, DC3 by incrementing only the smallest, DC3 in FIG. 6, of the current distances DC1, DC2, DC3 on completion of the previous step with its individual reference distance DRI3.

Therefore, the storage stage 7 is configured to store the smallest current deviation coefficient CECm and the current distances DC1m, DC2m, DC3m used to compute the smallest current deviation coefficient CECm.

Once all the current distances DC1, DC2, DC3 exceed the common reference distance DRC, the processing circuit 5 is configured to perform a final step STPF (FIG. 4).

In this final step STPF, the computation stage 8 is configured to compute the average of the current distances stored in the storage stage 7, stated otherwise the current distances DC1m, DC2m, DC3m used to compute the smallest current deviation coefficient CECm, so as to generate the real distance DRE.

Figure 7:
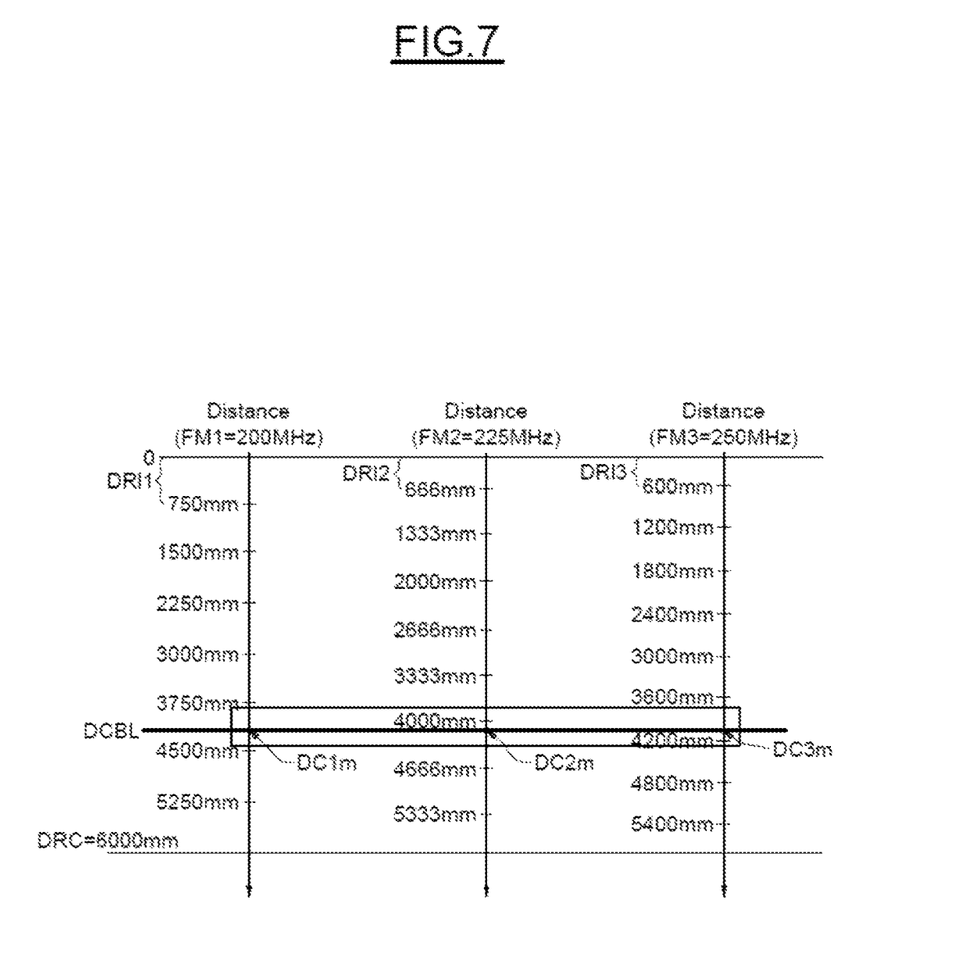

As illustrated by way of example in FIG. 7, the current distances DC1m, DC2m, DC3m used to compute the smallest current deviation coefficient CECm actually correspond to the current distances DC1, DC2, DC3 as close as possible to the targeted distance DCBL.

Since, in a real case, environmental noise and possible deviations may exist, the average AVG of these current distances DC1, DC2, DC3 as close as possible to the targeted distance DCBL may further decrease the influence of the noise and of the deviations.

Thus, one obtains a systematic and simplified method for determining the real distance separating an object and an optical detection system using at least one first and one second optical light radiation modulated respectively at at least one first and one second modulation frequency.

Furthermore, such a method and the corresponding system advantageously allow combined processing of all the reported distances corresponding to the multiple modulation frequencies and a decrease in the environmental noise or the standard deviations of the signals received after the reflections on the object. While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A method for determining a real distance separating an object and an optical detection system, the method comprising:
    emitting, by an emission circuit of the optical detection system, a plurality of radiations, wherein each radiation of the plurality of radiations is modulated at a respective modulation frequency;
    determining a plurality of reported distances based on reflections of the plurality of radiations received at the optical detection system, a respective reported distance of the plurality of reported distances being less than or equal to a respective reference distance, the respective reference distance being dependent on the respective modulation frequency;
    determining, by a processing circuit of the optical detection system, an initial deviation coefficient among the plurality of reported distances;
    incrementing, by the processing circuit, a smallest one of the plurality of reported distances with the respective reference distance corresponding to the smallest one of the plurality of reported distances to produce a plurality of current distances;
    determining, by the processing circuit, a current deviation coefficient among the plurality of current distances;
    incrementing, by the processing circuit, a smallest one of the plurality of current distances with the respective reference distance corresponding to the smallest one of the plurality of current distances;
    repeating the determining the current deviation coefficient and the incrementing the smallest one of the plurality of current distances until each of the plurality of current distances exceeds a common reference distance greater than each respective reference distance; and
    determining the real distance from the plurality of current distances associated with a smallest one of the current deviation coefficients.

2. The method according to claim 1, wherein:
    determining the initial deviation coefficient and incrementing the smallest one of the plurality of reported distances with the respective reference distance corresponding to the smallest one of the plurality of reported distances further comprises:
        storing the initial deviation coefficient and the plurality of reported distances; and
    determining the current deviation coefficient and incrementing the smallest one of the plurality of current distances with the respective reference distance corresponding to the smallest one of the plurality of current distances further comprises:
        comparing the current deviation coefficient and the initial deviation coefficient; and
        replacing the current deviation coefficient and the plurality of reported distances with the initial deviation coefficient and the plurality of current distances, respectively, in response to the current deviation coefficient being less than the current deviation coefficient.

3. The method according to claim 1, wherein the initial deviation coefficient is equal to a sum of respective absolute differences between respective reported distances taken two-by-two, and wherein the current deviation coefficient is equal to a sum of respective absolute differences between respective current distances taken two-by-two.

4. The method according to claim 1, wherein the initial deviation coefficient is equal to a sum of squares of respective differences between respective reported distances taken two-by-two, and wherein the current deviation coefficient is equal to a sum of squares of respective differences between respective current distances taken two-by-two.

5. The method according claim 1, wherein the common reference distance is a lowest common multiple of all respective reference distances.

6. The method according to claim 1, wherein the respective reference distance is equal to half a distance travelled by light for a duration equal to an inverse of the respective modulation frequency.

7. The method according to claim 1, further comprising respectively and sequentially measuring phase shifts of the reflections of the plurality of radiations relative to the plurality of radiations emitted by the optical detection system so as to determine the plurality of reported distances.

8. An optical detection system configured to determine a real distance separating an object and the optical detection system, the optical detection system comprising:
    an emitter configured to emit a plurality of radiations, wherein each radiation of the plurality of radiations is modulated at a respective modulation frequency;
    a plurality of optical detection circuits configured to receive reflections of the plurality of radiations; and
    a processing circuit configured to:
        determine a plurality of reported distances based on the reflections of the plurality of radiations, a respective reported distance of the plurality of reported distances being less than or equal to a respective reference distance, the respective reference distance being dependent on the respective modulation frequency;
        determine an initial deviation coefficient among the plurality of reported distances;
        increment a smallest one of the plurality of reported distances with the respective reference distance corresponding to the smallest one of the plurality of reported distances to produce a plurality of current distances;
        determine a current deviation coefficient among the plurality of current distances;
        increment a smallest one of the plurality of current distances with the respective reference distance corresponding to the smallest one of the plurality of current distances;
        repeat the determining the current deviation coefficient and the incrementing the smallest one of the plurality of current distances until each of the plurality of current distances exceeds a common reference distance greater than each respective reference distance; and
        determine the real distance from the plurality of current distances associated with a smallest one of the current deviation coefficients.

9. The optical detection system according to claim 8, wherein the processing circuit comprises:

a storage stage configured to, in determining the initial deviation coefficient and incrementing the smallest one of the plurality of reported distances with the respective reference distance corresponding to the smallest one of the plurality of reported distances, store the initial deviation coefficient and the plurality of reported distances; and a computation stage configured to, in determining the current deviation coefficient and incrementing the smallest one of the plurality of current distances with the respective reference distance corresponding to the smallest one of the plurality of current distances, compare the current deviation coefficient and the initial deviation coefficient and, replace the current deviation coefficient and the plurality of reported distances with the initial deviation coefficient and the plurality of current distances, respectively, in response to the current deviation coefficient being less than the current deviation coefficient.

10. The optical detection system according to claim 8, wherein the initial deviation coefficient is equal to a sum of respective absolute differences between respective reported distances taken two-by-two, and wherein the current deviation coefficient is equal to a sum of respective absolute differences between respective current distances taken two-by-two.

11. The optical detection system according to claim 8, wherein the initial deviation coefficient is equal to a sum of squares of respective differences between respective reported distances taken two-by-two, and wherein the current deviation coefficient is equal to a sum of squares of respective differences between respective current distances taken two-by-two.

12. The optical detection system according to claim 8, wherein the common reference distance is a lowest common multiple of all respective reference distances.

13. The optical detection system according to claim 8, wherein the respective reference distance is equal to half a distance travelled by light for a duration equal to an inverse of the respective modulation frequency.

14. The optical detection system according to claim 8, wherein the processing circuit further comprises a processing stage configured to respectively and sequentially measure phase shifts of the reflections of the plurality of radiations relative to the plurality of radiations emitted by the optical detection system so as to determine the plurality of reported distances.

15. The optical detection system according to claim 8, wherein the plurality of optical detection circuits comprises at least one single-photon detector.

16. The optical detection system according to claim 15, wherein the at least one single-photon detector comprises a detector of single-photon avalanche diode type.

17. The optical detection system according to claim 8, wherein the plurality of optical detection circuits comprises at least one photodetector of fast photodiode type.

18. An electronic apparatus, comprising:
an optical detection system configured to determine a real distance separating an object and the optical detection system, the optical detection system comprising:
an emitter configured to emit a plurality of radiations, wherein each radiation of the plurality of radiations is modulated at a respective modulation frequency;
a plurality of optical detection circuits configured to receive reflections of the plurality of radiations; and
a processing circuit configured to:
determine a plurality of reported distances based on the reflections of the plurality of radiations, a respective reported distance of the plurality of reported distances being less than or equal to a respective reference distance, the respective reference distance being dependent on the respective modulation frequency;
determine an initial deviation coefficient among the plurality of reported distances;
increment a smallest one of the plurality of reported distances with the respective reference distance corresponding to the smallest one of the plurality of reported distances to produce a plurality of current distances;
determine a current deviation coefficient among the plurality of current distances;
increment a smallest one of the plurality of current distances with the respective reference distance corresponding to the smallest one of the plurality of current distances;
repeat the determining the current deviation coefficient and the incrementing the smallest one of the plurality of current distances until each of the plurality of current distances exceeds a common reference distance greater than each respective reference distance; and
determine the real distance from the plurality of current distances associated with a smallest one of the current deviation coefficients.

19. The electronic apparatus according to claim 18, wherein the electronic apparatus comprises a tablet or a cellular mobile telephone.

20. A motor vehicle, comprising:
an optical detection system configured to determine a real distance separating an object and the optical detection system, the optical detection system comprising:
an emitter configured to emit a plurality of radiations, wherein each radiation of the plurality of radiations is modulated at a respective modulation frequency;
a plurality of optical detection circuits configured to receive reflections of the plurality of radiations; and
a processing circuit configured to:
determine a plurality of reported distances based on the reflections of the plurality of radiations, a respective reported distance of the plurality of reported distances being less than or equal to a respective reference distance, the respective reference distance being dependent on the respective modulation frequency;
determine an initial deviation coefficient among the plurality of reported distances;
increment a smallest one of the plurality of reported distances with the respective reference distance corresponding to the smallest one of the plurality of reported distances to produce a plurality of current distances;
determine a current deviation coefficient among the plurality of current distances;
increment a smallest one of the plurality of current distances with the respective reference distance corresponding to the smallest one of the plurality of current distances;
repeat the determining the current deviation coefficient and the incrementing the smallest one of the plurality of current distances until each of the plurality of current distances exceeds a common reference distance greater than each respective reference distance; and determine the real distance from the plurality of current distances associated with a smallest one of the current deviation coefficients.

\* \* \* \* \*